United States Patent [19]
Alley et al.

[11] Patent Number: 6,066,949
[45] Date of Patent: May 23, 2000

[54] GRADIENT CHARACTERIZATION USING FOURIER-TRANSFORM

[75] Inventors: Marcus T. Alley, Palo Alto; Norbert J. Pelc, Los Altos, both of Calif.

[73] Assignee: The Board of Trustees of the Leland Stanford Junior University, Palo Alto, Calif.

[21] Appl. No.: 08/974,582

[22] Filed: Nov. 19, 1997

[51] Int. Cl.$^7$ .................................................. G01V 3/00
[52] U.S. Cl. ......................... 324/309; 324/307; 600/410
[58] Field of Search .................................. 324/309, 307, 324/320, 306; 600/410, 420, 413

[56] References Cited

U.S. PATENT DOCUMENTS

| | | | |
|---|---|---|---|
| 4,698,591 | 10/1987 | Glover et al. | 324/307 |
| 4,950,994 | 8/1990 | Glover et al. | 324/320 |

OTHER PUBLICATIONS

Nikolaos G. Papdakis et al., "A General Method for Measurement of the Time Integral of Variant Magnetic Field Gradients: Application to 2D Spiral Imaging", Magnetic Resonance Imaging, vol. 15, No. 5, pp. 567–578, (1997).

A. A. Wilkinson et al., "Spatially Resolved Measurement of Induced Time–Variant Magnetic Fields in 1, 2, or 3 Dimensions: Application to 2D k–space Trajectory Determination", Procedings of the ISMRM 4th Annual Meeting, New York, p. 1490, (1996).

*Primary Examiner*—Christine K. Oda
*Assistant Examiner*—Brij B. Shrivastav
*Attorney, Agent, or Firm*—Townsend and Townsend and Crew LLP; Henry K. Woodward

[57] ABSTRACT

Disclosed is a method for characterizing the gradient subsystem of a Magnetic Resonance (MR) system. The method uses a Fourier-transform analysis to directly measure the k-space trajectory produced by an arbitrary gradient waveform. In addition, the method can be easily extended to multiple dimensions, and can be adapted to measuring residual gradient effects such as eddy currents. Several examples of gradient waveform and eddy-current measurements are presented. Also, it is demonstrated how the eddy-current measurements are presented. Also, it is demonstrated how the eddy-current measurements can be parameterized with an impulse-response formalism for later use in system tuning. When compared to a peak-fitting analysis, this technique provides a more direct extraction of the k-space measurements, which reduces the possibility of analysis error. This approach also has several advantages as compared to the conventional eddy-current measurement technique, including the ability to measure very short time constant effects.

24 Claims, 7 Drawing Sheets

GRADIENT CHARACTERIZATION USING FOURIER-TRANSFORM

The U.S. Government has rights in the disclosed invention pursuant to NIH grant F32 DK09232 (M.T.A.) with Stanford University, Assignee.

BACKGROUND OF THE INVENTION

This invention relates generally to magnetic resonance imaging (MRI), and more particularly the invention relates to performance characterization of MRI systems including measuring the spatial distribution of the system output and determining the actual system response following the application of a magnetic field gradient waveform.

The ability to measure gradient fidelity can be important in several applications. Image acquisition and RF excitation techniques generally assume that the desired time-varying gradient fields and resulting k-space trajectories can be faithfully created on the magnetic resonance system. Problems can arise from a variety of effects, such as amplitude tracking errors, temperature-related drifts, and system instabilities. As a result, reconstructed images and excitation profiles can suffer from degradations in quality A. Takahashi, T. Peters, "Compensation of multidimensional selective excitation pulses using measured k-space trajectories", Magn. Reson. Med. 34:446–456 (1995); D. M. Spielman, J. M. Pauly, "Spiral imaging on a smallbore system at 4.7 T, Magn. Reson. Med., 34:580–585 (1995); A. B. Kerr, J. M. Pauly, C. H. Meyer, D. G. Nishimura, "Image quality for spiral-based sequences", Proc., SMR, 3rd Annual Meeting, Nice, p. 622 (1995); and W. Block, J. Pauly, A. Kerr, D. Nishimura, "Improved spectral-spatial pulses through $B_o$ eddy current compensation", Proc., ISMRM, 4th Annual Meeting, New York, p. 196 (1996). Further errors can occur if any residual gradients are present after the desired waveforms have terminated. For example, the strong gradients used in diffusion-weighted imaging can produce eddy currents which can cause undesired phase shifts and even distortions and aspect ratio changes in the final images K. Butts, A. de Crespigny, J. M. Pauly, M. Moseley, "Diffusion-weighted interleaved echo-planar imaging with a pair of orthogonal navigator echoes", Magn. Reson. Med. 35:763–770 (1996); and J. C. Haselgrove, J. R. Moore, "Correction for distortion of echo-planar images used to calculate the apparent diffusion coefficient, Magn. Reson. Med. 36:960–964 (1996). Finally, unwanted phase effects can occur even under ideal conditions. Any gradient will produce concomitant Maxwell gradients that, if strong enough, can cause distortions in off-isocenter images D. G. Norris, J. M. S. Hutchison, "Concomitant magnetic field gradients and their effects on imaging at low magnetic field strengths", Magn. Reson. Imaging, 8:33–37 (1990); R. M Weisskoff, M. S. Cohen, R. R. Rzedzian, "Nonaxial whole-body instant imaging", Magn. Reson. Med. 29:796–803 (1993); and M. A. Bernstein, X. Zhou, K. F. King, A. Ganin, N. J. Pelc, G. H. Glover, "Shading artifacts in phase contrast angiography induced by Maxwell terms; Analysis and Correction", Proc., ISMRM, 5th Annual Meeting, Vancouver, p. 110 (1997).

Several procedures have been used to measure gradient behavior on a Magnetic Resonance (MR) system. Eddy current characterization can be done with the "grafidy" technique, which uses small test samples and a strong test gradient followed at various delays by an RF pulse G. H. Glover, N. J., Pelc, "Method for magnetic field gradient eddy current compensation", U.S. Pat. No. 4,698,591 (1987) and G. H. Glover, N. J. Pelc, K. M. Bradshaw, "Gradient and polarizing field compensation", U.S. Pat. No. 4,950,994 (1990). The resulting FID is then analyzed to measure the residual fields. The "peak-fitting" technique for measuring k-space trajectories, a method which is related to the present invention, analyzes the echo peaks produced by the combination of so-called self-encoding gradients and a test waveform A. Takahashi, T. Peters, "Compensation of multidimensional selective excitation pulses using measured k-space trajectories", Magn. Reson. Med. 34:446–456 (1995); T. Onodera, S. Matsui, K. Sekihara, H. Kohno, "A method of measuring field-gradient modulation shapes. Application to high speed NMR spectroscopic imaging", J. Phys. E. Sci. Instrum., 20:416–419 (1987); and A. Takahashi, T. M. Peters, "Measurement of k-space trajectories for RF pulse design", Proc., SMRM, 12th Annual Meeting, New York, p. 424 (1993).

The present invention is directed to an alternative procedure for measuring the magnetic field gradient produced by an arbitrary gradient waveform.

SUMMARY OF THE INVENTION

In accordance with the invention, raw data are collected during a time interval of interest following a phase-encoding pulse. Images of the phase distribution as a function of time can then be created via Fourier transform. This distribution is then processed to extract the actual k-space trajectory produced in the scanner. The technique is easily extended to produce two-dimensional (2D) and three-dimensional (3D) phase maps which contain information about cross talk between gradient axes as well as higher-order spatial variations. Compared to peak fitting, this technique provides a model-independent approach for extracting k-space data with a higher signal-to-noise ratio (SNR). Unlike grafidy, this procedure does not require an RF pulse following the termination of the test gradient. Therefore, eddy-current characterization can begin immediately and short time effects can be more easily investigated.

The invention and objects and features thereof will be more readily apparent from the following detailed description and appended claims when taken with the drawings.

BRIEF DESCRIPTION OF THE DRAWINGS

FIG. 6A illustrates the phase distribution along the y axis at x,z=0; and FIG. 6B illustrates the phase distribution along the z axis at x,y=0. only the first 12 ms of the full acquisition are shown.

DETAILED DESCRIPTION OF THE PREFERRED EMBODIMENTS

We first present the theory of the invention along with several examples of its application. We then show how k-space trajectories can be measured from arbitrary waveforms, and discuss how this approach differs from the peak-fitting technique. Four-dimensional (three spatial dimensions and time) phase maps will be shown from an eddy-current measurement, and we demonstrate how these can be used to visualize Maxwell phase effects. These phase maps are then used with an impulse-response formalism to characterize the behavior of the underlying gradient hardware.

Theory

Figure 1:
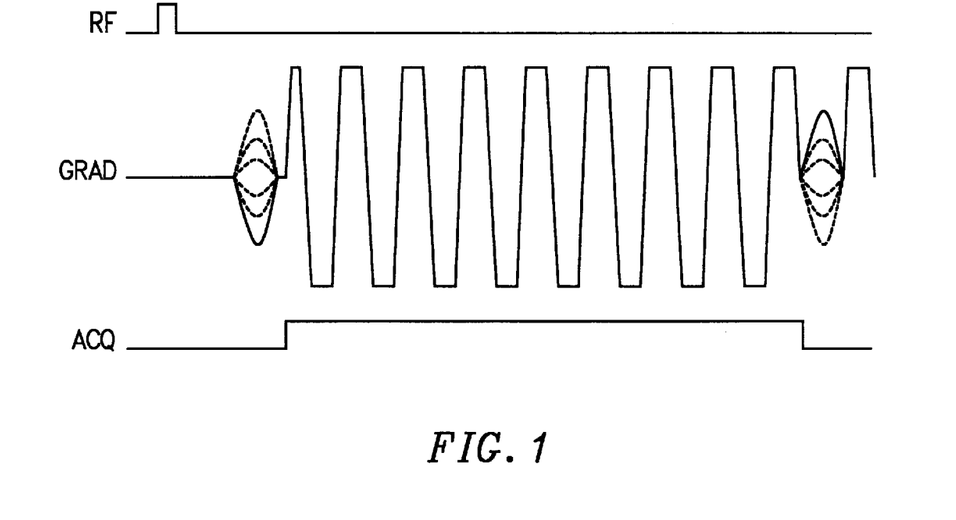
FIG. 1 is the data acquisition sequence for measuring one-dimensional k-space trajectories. In this example an echo-planar readout waveform is measured.

A representative sequence for measuring k-space trajectories is shown in FIG. 1. Illustrated is the data acquisition sequence for measuring one-dimensional k-space trajectories. In this example an echo-planar readout waveform is measured. A hard RF excitation pulse is followed by a phase-encoding gradient and the "test waveform" g(t) under investigation. In the example shown in FIG. 1, g(t) is an echo-planar readout waveform placed along the x axis. A phase-encode rewinder and spoiler gradient are included so that a short sequence repetition time (TR) may be used for faster data acquisition. The acquired signal following a particular phase encode can be written as in K. F. King, P. R., Moran, "A unified description of NMR imaging, data-collection strategies, and reconstuction", *Medical Physics* 11:1–13 (1984):

$$S(k_{pe}, t) = \int d\vec{r}\, p(\vec{r}, t) e^{-i\{\epsilon(\vec{r}, t)+(k(t)+k_{pe})x\}}, \qquad [1]$$

where k(t) is the time evolution of the k-space trajectory produced by g(t), and $k_{pe}$ is the k-space offset produced by the phase-encoding lobe. The phase term $\epsilon(\vec{r}, t)$ contains any contributions from eddy currents, susceptibility effects, or local inhomogeneities. The relaxation-modulated density of the test phantom is denoted by $p(\vec{r}, t)$, where the explicit time dependence reflects any changes in magnitude resulting from processes such as $T_2$ decay or intravoxel dephasing.

Following the acquisition, a one dimensional Fourier transform is applied in the phase-encoding direction. The result of this operation can be written as:

$$I(x, t) = FT\{S(k_{pe}, t)\} = p(x, t) e^{-i\{\epsilon(x, t)+k(t)x\}}. \qquad [2]$$

In principle, the k-space trajectory of the test waveform can be extracted from the phase of Eq. [2]. However, any linear component of $\epsilon(x, t)$ will also contribute to the apparent values of k(t). This problem can be addressed by acquiring a second set of data with the test waveform inverted. Equation [2] can be written to reflect both of these operations as:

$$I_{\pm}(x, t) = p(x, t) e^{-i\{\phi(x, t)\pm\psi(x, t)\pm k(t)x\}}. \qquad [3]$$

Here the phase term $\epsilon(x, t)$ has been written in terms of its even and odd components ($\phi(x, t)$ and $\psi(x, t)$, respectively), under the transformation g(t) →-g(t). If $\theta_{+/-}(x, t)$ represents the phase from Eq. [3], the odd phase terms arising from the execution of the test waveform can be isolated with the combination:

$$\theta_+(x, t) - \theta_-(x, t))/2 = \psi(x, t) + k(t)x. \qquad \text{Eq. [4]}$$

The retention of the even phase terms is desirable when studying Maxwell effects. In this case, the second data set can be aquired with the amplitude of the test waveform set to zero. The subtraction in Eq. [4] will then retain $\phi(x, t)$ and only remove those phase effects that are not due to the execution of the test waveform. Examples of both configurations will be shown below.

The data processing following the Fourier transform requires some care. The phase from Eq. [3] can be orders of magnitude greater than $\pi$ at the extreme values of k(t). To reduce potential errors, a temporal phase unwrapping approach is employed. The unwrapped phase data at time $t_n$ are generated recursively by:

$$U(\theta_\pm(x, t_n)) = U(\theta\pm(x, t_n) - \theta_\pm(x, t_{n-1})) + U(\theta_\pm(x, t_{n-1})). \text{ tm [4]}$$

Here U(·) represents an unwrapping algorithm to remove any phase discontinuities. Following this operation, the data are combined as in Eq. [4] and k(t) is extracted using at least squares linear fit to the spatial dependence.

The number of phase encodes, $N_{pe}$, needed for this technique is dependent on the characteristics of the waveform under measurement. At the maximum value of k(t) a phase shift of $\pi$ is produced over a spatial resolution element $\Delta x$. To resolve this phase accrual $N_{pe}$ must satisfy:

$$\frac{D}{N_{pe}} \leq \Delta x \qquad [5]$$

or equivalently, $$N_{pe} \geq \max\{k(t)\}D, \qquad [6]$$

where D represents the field-of-view (FOV) used in the measurement process.

This technique can be easily extended to multiple spatial dimensions by phase encoding the relevant gradient axes. For example, a spiral waveform with a spatial resolution of 1 mm can be examined with 10 phase encodes per axis when using a 1 cm diameter test phantom. Clearly, larger phantoms and higher dimensionality rapidly leads to lengthened acquisition times.

Figure 2:
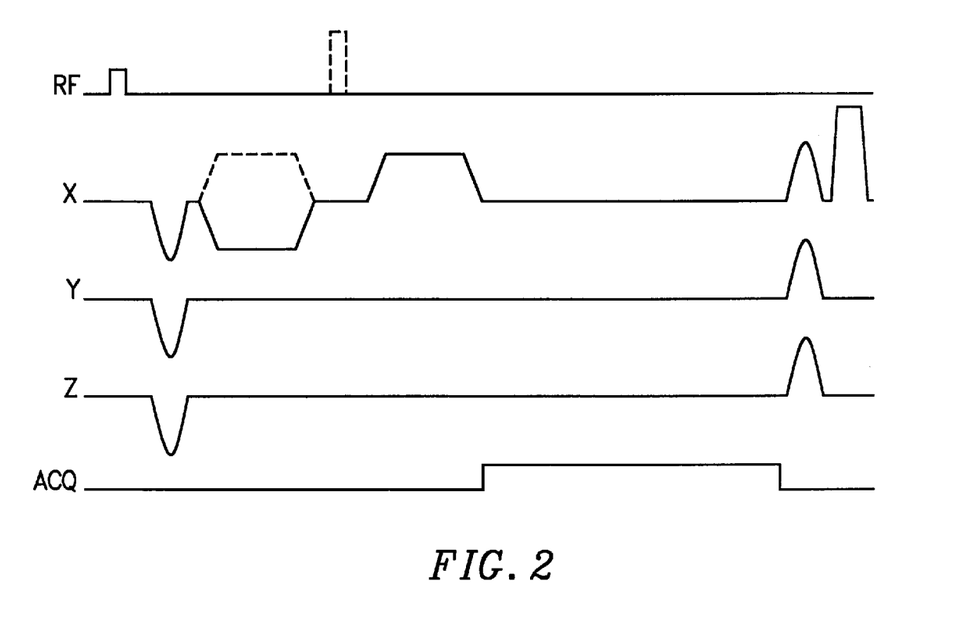
FIG. 2 illustrates the data acquisition sequence for measuring residual gradient effects. The waveforms for stimulating eddy-current effects can be configured in either a gradient-echo (solid line) or spin-echo (dashed line) mode, with the addition of a 180° refocusing pulse) mode.

A practical 3D application lies in measuring the residual effects following the execution of a gradient waveform. In this implementation, a gradient pair designed to induce eddy currents is placed along a given axis after the phase-encoding lobes. An example of this configuration is shown in FIG. 2, which shows that this gradient pair can be configured either in a gradient-echo mode as a bipolar set, or in a spin-echo mode with the addition of a 180° refocusing pulse. FIG. 2 illustrates the data acquisition sequence for measuring residual gradient effects. The waveforms are for stimulating eddy-current effects can be configured in either a gradient-echo (solid line) or spin-echo (dashed line with the addition of a 180° refocusing pulse) mode. At the end of this pair, the receiver is turned on and data are acquired for a given period of time.

As before, a second set of data is acquired with the polarity of the gradient pair reversed. After a three dimensional Fourier transform, the data have the form (cf. Eq. [3]):

$$I_{\pm}(\vec{r}, t)e^{-i\{\phi(\vec{r}, t) \pm \psi(\vec{r}, t) \pm \vec{k}(t)\cdot \vec{r}\}}. \quad [7]$$

Here $\vec{k}(t)$ refers to the k-space trajectory produced by any residual gradients present during the readout window. The necessary number of phase encodes per axis is given by Eq. [6]. To keep N<sub>pe</sub> small, the eddy current inducing gradient waveform is designed to have substantially zero gradient area (for the gradient echo mode). The width an separation of the lobes should be selected with appreciation for the time constants of the eddy currents being characterized, as should the duration of the data acquisition window. Ideally, all should be comparable to or longer than the relevant time constants. If the two lobes are too close together, the eddy currents induced by the two lobes of opposite polarity will cancel at least partially. In the spin-echo mode, it is not necessary for the lobes to have width and separation that are longer than the eddy current time constants. As known by one of skill in the art, the temporal location of the 180 degree pulse must be taken into account when analyzing the data obtained with the spin-echo mode. Because the maximum value of $\vec{k}(t)$ is much smaller than in the case of characterizing the k-space trajectory of an imaging gradient, the required number of phase encodes per axis is greatly reduced. After acquisition, the data are processed in a fashion similar to the one dimensional case described above.

Characterization of eddy-current effects is useful for system diagnostics and tuning. Eddy-current compensation is typically performed with a set of pre-emphasis filters that correct for gradient distortions G. H. Glover, N. J., Pelc, "Method for magnetic field gradient eddy current compensation", U.S. Pat. No. 4,698,591 (1987). With this in mind, an impulse-response formalism can be used to characterize the measured k-space trajectories extracted from the present technique. The gradient waveform produced at the scanner can be written as:

$$G(t) = \int d\alpha G'(\alpha) h(t-\alpha). \quad [8]$$

Here G' (α) represents the applied gradient excitation waveform, which in this case is a trapezoid. The impulse-response function h(t) is approximated by the sum of a finite number of exponential terms and can be defined as [10]:

$$h(t) = \delta(t) + \sum_{k=1}^{N} g_k e^{-\lambda_k t}, \quad [9]$$

where δ(t) is the Dirac delta function and $g_k$ and $\lambda_k$ are the amplitude and rate constants for the $k^{th}$ exponential component, respectively. The k-space trajectory extracted from Eq. [7] can then be modeled according to:

$$k(t) = \gamma \int_{t_o}^{t} ds\, G(s), \quad [10]$$

where $t_o$ is the starting time of the gradient.

Experiments

All data were collected on a commercial 1.5 T MR scanner (Signa, GE Medical Systems, Milwaukee, Wis.) with a maximum gradient amplitude of 22 mT/m and a rise time of 184 μs. The 1D technique was used to measure both spiral and echo-planar k-space trajectories. A 10 cm diameter spherical phantom filled with distilled water was used for the measurements. The spiral waveform was designed to produce an isotropic in-plane resolution of 1.6 mm. A total of 74 phase-encoding steps was used in data acquisition. The echo-planar waveform was designed to produce a resolution of 1.9 mm, and a total of 66 phase-encoding steps were used in the data acquisition. In both cases, $N_{pe}$ was chosen to be approximately 20% greater than the minimum value specified in Eq. [6] to assure adequate sampling. For each phase-encode value, data were taken with alternate test waveform polarities. The sequence TRs for the spiral and echo-planar acquisitions were 90 and 110 ms respectively, producing a total scan time of 13.3 and 14.5 s.

The measured data were Fourier-transformed and processed as described above to extract k(t). For comparison, the 1D data of the spiral waveform trajectory were also analyzed using the peak-fitting technique described in A. Takahashi, T. Peters, "Compensation of multidimensional selective excitation pulses using measured k-space trajectories", *Magn. Reson. Med.* 34:446–456 (1995).

The 3D technique was used to investigate the presence of eddy currents. A 10 cm diameter spherical phantom filled with distilled water and placed at the isocenter of the magnet was used for these measurements. Test gradients were created with a pair of trapezoidal waveforms played out along the y axis of the scanner. Each waveform had an amplitude of 1.92 G/cm, a duration of 19.692 ms, and a ramp width of 0.288 ms. Raw data were collected for 65 ms immediately following the completion of the second waveform. It was found that 8 phase encodes per axis were sufficient to avoid aliasing (i.e. to satisfy eqn. [6]). Three different experiments were performed: the first used a gradient-echo acquisition, while the second and third were configured as a spin-echo acquisition. For the gradient-echo experiment the baseline data at each phase-encode value were acquired with the amplitude of the waveform pair set to zero. For the first spin-echo acquisition, data were taken at each phase-encode value with alternating polarities of the waveform set. The second spin-echo experiment was used as the basis for an error estimation analysis, and therefore the amplitude of the waveform pair was set to zero for all excitations. For all three experiments a sequence TR of 200 ms was used. Therefore, each acquisition required 3.4 min.

The spin-echo 3D data were used to investigate eddy-current effects. The k-space trajectories produced by the residual gradients were extracted from the unwrapped phase of Eq. [4] using a linear regression analysis. A Levenberg-Marquardt nonlinear routine was then used to fit the eddy-current k-space trajectories to the impulse-response model W. H. Press, S. A. Teukolsky, W. T. Vetterling, B. P. Flannery, "Numerical Recipes in C", Cambridge University Press, New York (1992). A value for the uncertainty in the phase of Eq. [7] was generated by first constructing a subtraction image from the zero-amplitude spin-echo data. The standard deviation from a region-of-interest in this image was used to generate an estimate of the noise, $\sigma(I_o)$. The final phase uncertainty was then generated as T. E. Conturo, G. D. Smith, "Signal-to-noise in phase angle reconstruction: Dynamic range extension using phase reference offset", *Magn. Reson. Med.*, 15:420–437 (1990):

$$\delta\phi \pm (\vec{r}, t) = \frac{\phi(I_o)}{|I_\pm(\vec{r}, t)|}. \quad [11]$$

This uncertainty was propagated throughout the analysis and used as a basis for determining the quality of the fit at each stage.

As a test of the predictive ability of the impulse-response formalism, the derived parameters were used to predict the eddy-current effects in a phase-contrast acquisition. The simulation was compared to a sagittal image obtained with an actual phase-contrast sequence. The velocity sensitizing gradients were placed along the y axis of the scanner, and a velocity encoding value of 10 mm/s was chosen to generate large eddy-current effects. The readout direction was placed along the y axis, while the spatial phase encoding direction was placed along the z axis.

Results

Figure 3:
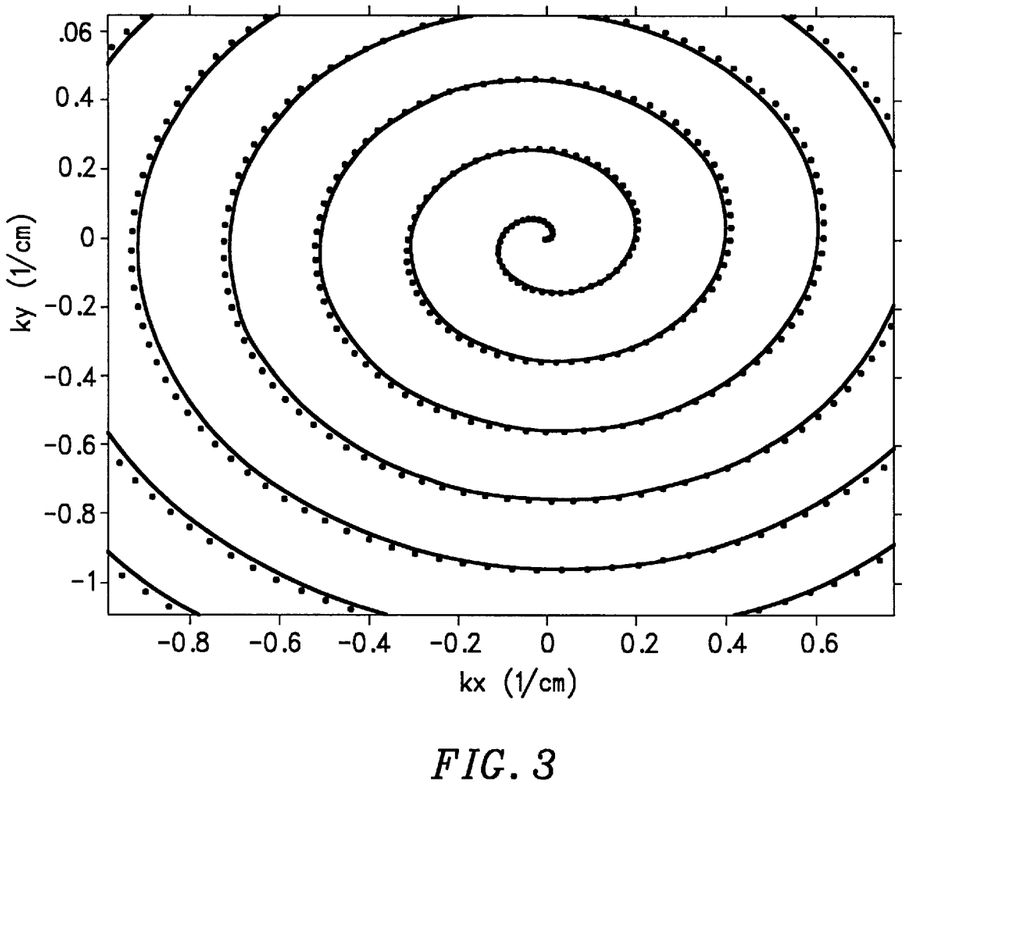
FIG. 3. shows the expanded central region of the spiral trajectory. The solid line marks the ideal path while the dots indicate the k-space points that were actually measured.

A comparison of the measured and ideal spiral k-space trajectories is shown in FIG. 3. Illustrated is the expanded central region of the spiral trajectory. The solid line marks the ideal path while the dots indicate the k-space points that were actually measured. While the largest differences for this system are only on the order of 1%, these deviations will produce zeros in the final images if the ideal trajectory is used in the gridding algorithm of the reconstruction procedure D. M. Spielman, J. M. Pauly, "Spiral imaging on a smallbore system at 4.7 T, *Magn. Reson. Med.*, 34:580–585 (1995). These artifacts can be significantly reduced if the measured k-space trajectories are used instead.

Figure 4:
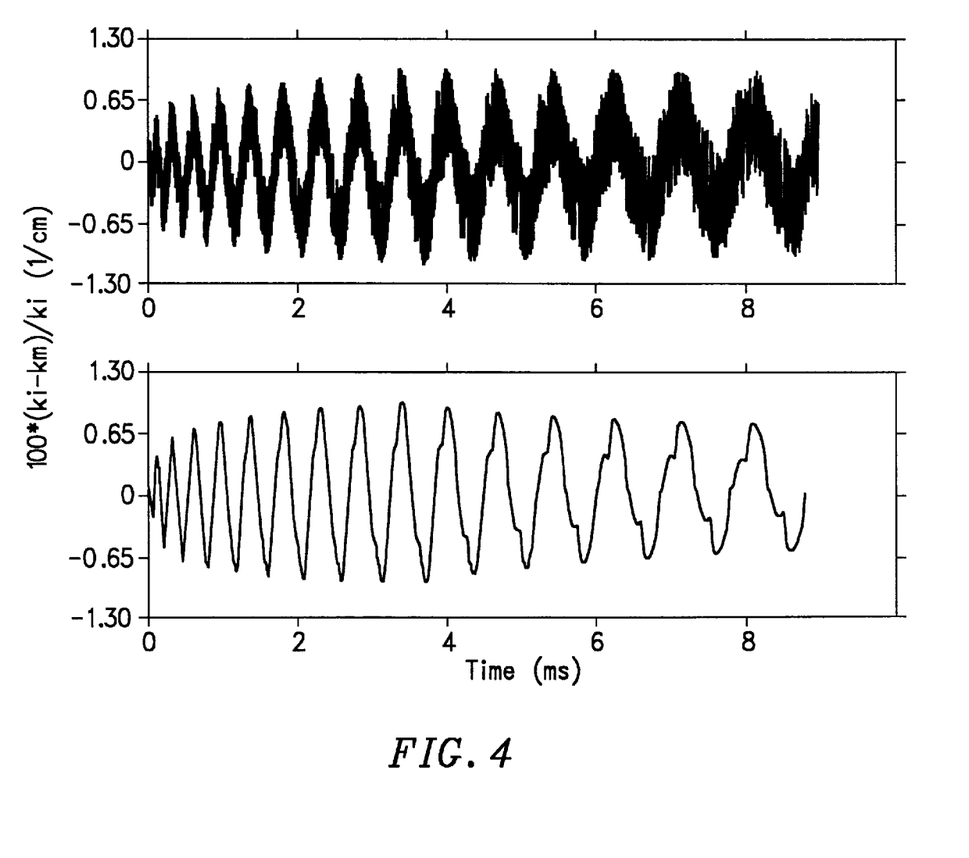
FIG. 4 illustrates the difference between the ideal (ki) and measured (km) k-space trajectory as a percentage of ki. The results were generated using a peak-fitting analysis (top) and the Fourier-transform technique (bottom).

FIG. 4 compares a spiral waveform measurement from both the present Fourier-transform technique and the prior art peak-fitting analysis. Illustrated is the difference between the ideal (ki) and measured (km) k-space trajectory as a percentage of ki. The results were generated using a peak-fitting analysis (top) and the Fourier-transform technique (bottom). Both figures show the percentage difference between the measured and ideal trajectories. Here it is clearly apparent that the Fourier-transform analysis produces much smoother higher SNR results than the peak-fitting approach. While in this case the differences between the measured and ideal trajectories are small for both methods, any fluctuations will be amplified if a differentiation is performed to calculate the underlying gradient waveform.

Figure 5:
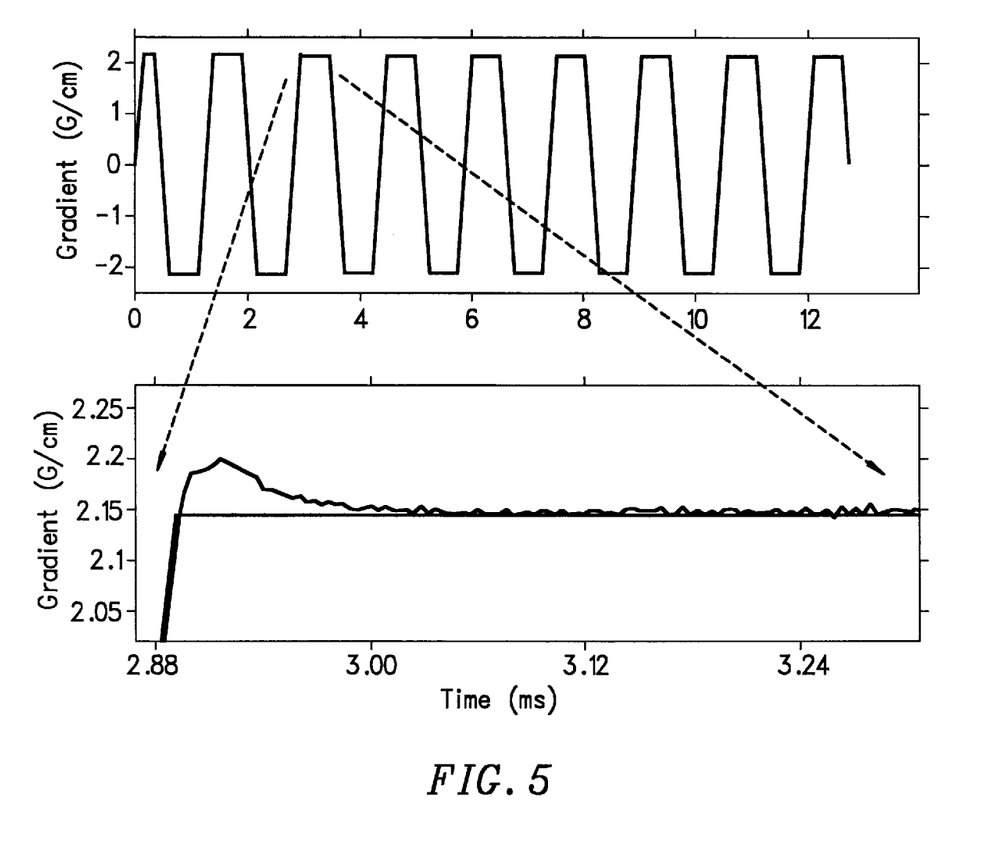
FIG. 5 illustrates in the upper plot shows the ideal and measured echo-planar gradient waveforms together. The lower plot shows an expanded region of one lobe from the full waveform. It is apparent that the amplifier initially overshoots the target amplitude before settling to the correct value.

An example of a measured gradient waveform is shown in FIG. 5. The upper plot shows the ideal and measured echo-planar gradient waveforms together. The lower plot shows an expanded region of one lobe from the full waveform. It is apparent that the amplifier initially overshoots the target amplitude before settling to the correct value. In this case, the measured k-space trajectory of the echo-planar waveform was differentiated to reveal the underlying gradient field. The SNR of the Fourier-transform analysis was sufficient to show that the gradient amplifier consistently overshot the target amplitude before settling to the correct value.

Figure 6:
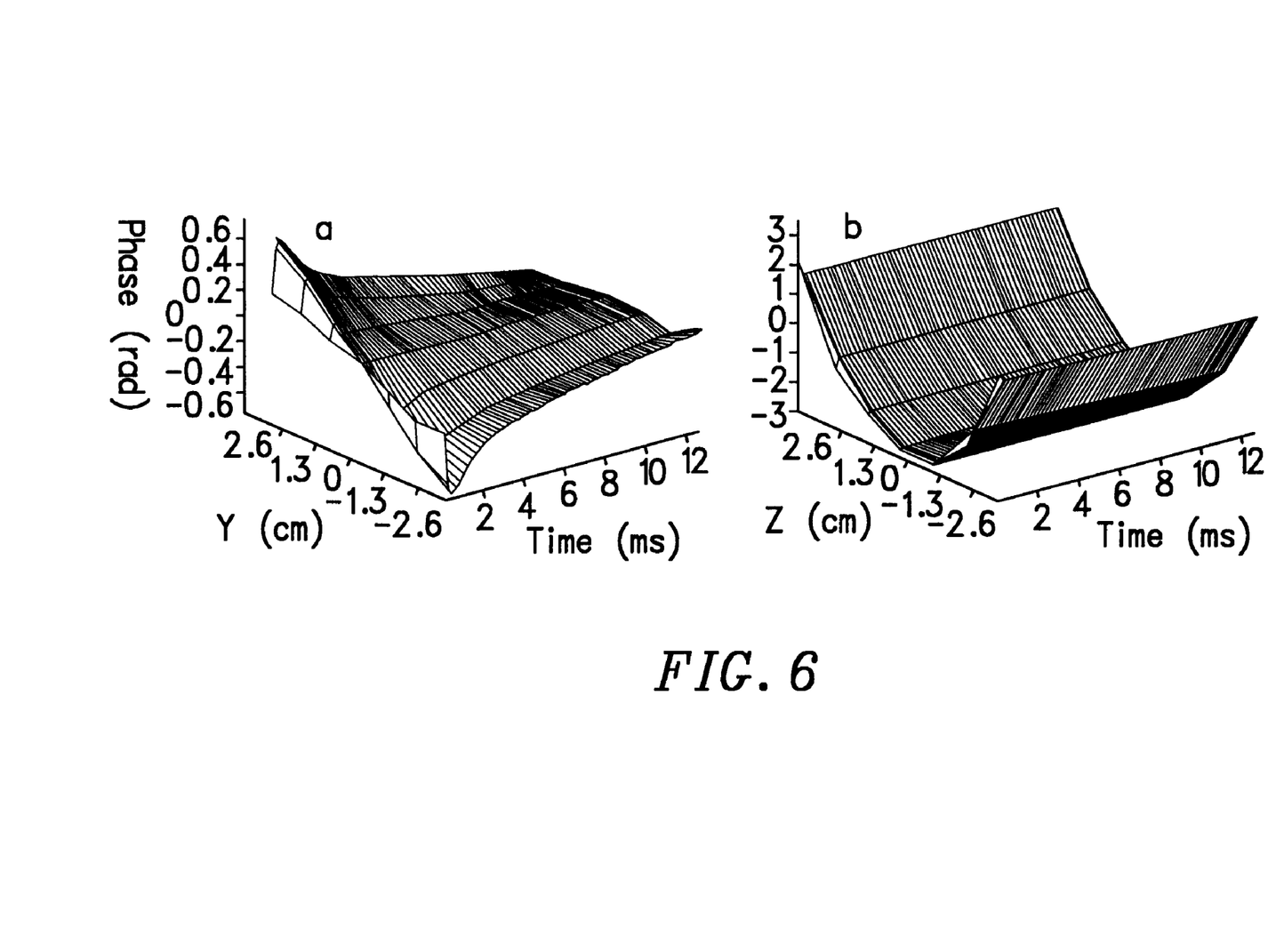
FIG. 6 is a set of phase profiles from the 3D gradient-echo experiment.

A set of phase profiles from the 3D gradient-echo eddy-current experiment is shown in FIG. 6. Illustrated is a set of phase profiles from the 3D gradient-echo experiment. FIG. 6a shows the phase distribution along the y-axis at x,z=0, while FIG. 6b illustrates the phase distribution along the z axis at x,y=0. Only the first 12 ms of the full acquisition are shown. The distribution along the y axis of the phantom at the isocenter of the x and z axes is shown in FIG. 6(a). The early time points capture the end of the gradient waveform. Following this, a residual short term eddy current is apparent, while a longer term component continues past the end of the data acquisition. FIG. 6(b) shows the phase distribution along the z axis of the phantom at the isocenter of the x and y axes. The quadratic phase profile is due to the Maxwell field induced by the test waveforms. The phase distribution as a function of z at x=O can be shown to be M. A. Bernstein, X. Zhou, K. F. King, A. Ganin, N. J. Pelc, G. H. Glover, "Shading artifacts in phase contrast angiography induced by Maxwell terms; Analysis and Correction", Proc., ISMRM, 5t Annual Meeting, Vancouver, p. 110 (1997):

$$\phi(z) = \frac{\gamma z^2}{2B_o} \int ds g^2(s), \quad [12]$$

where $B_o$ is the main field strength and g(t) represents the bipolar gradient pair on the y axis. Note that because of the $g^2$(t) term, this effect cannot be seen if the reference data set is obtained with amplitude of the bipolar gradient pair inverted. It was seen here because we purposely chose to use a zero-amplitude measurement as a reference. The quadratic component of the phase profile in FIG. 6(b) was measured to be 0.24 rad/cm$^2$. This compares well with the predicted curvature from Eq. [12] of 0.23 rad/cm$^2$ at 1.5 T.

Figure 7:
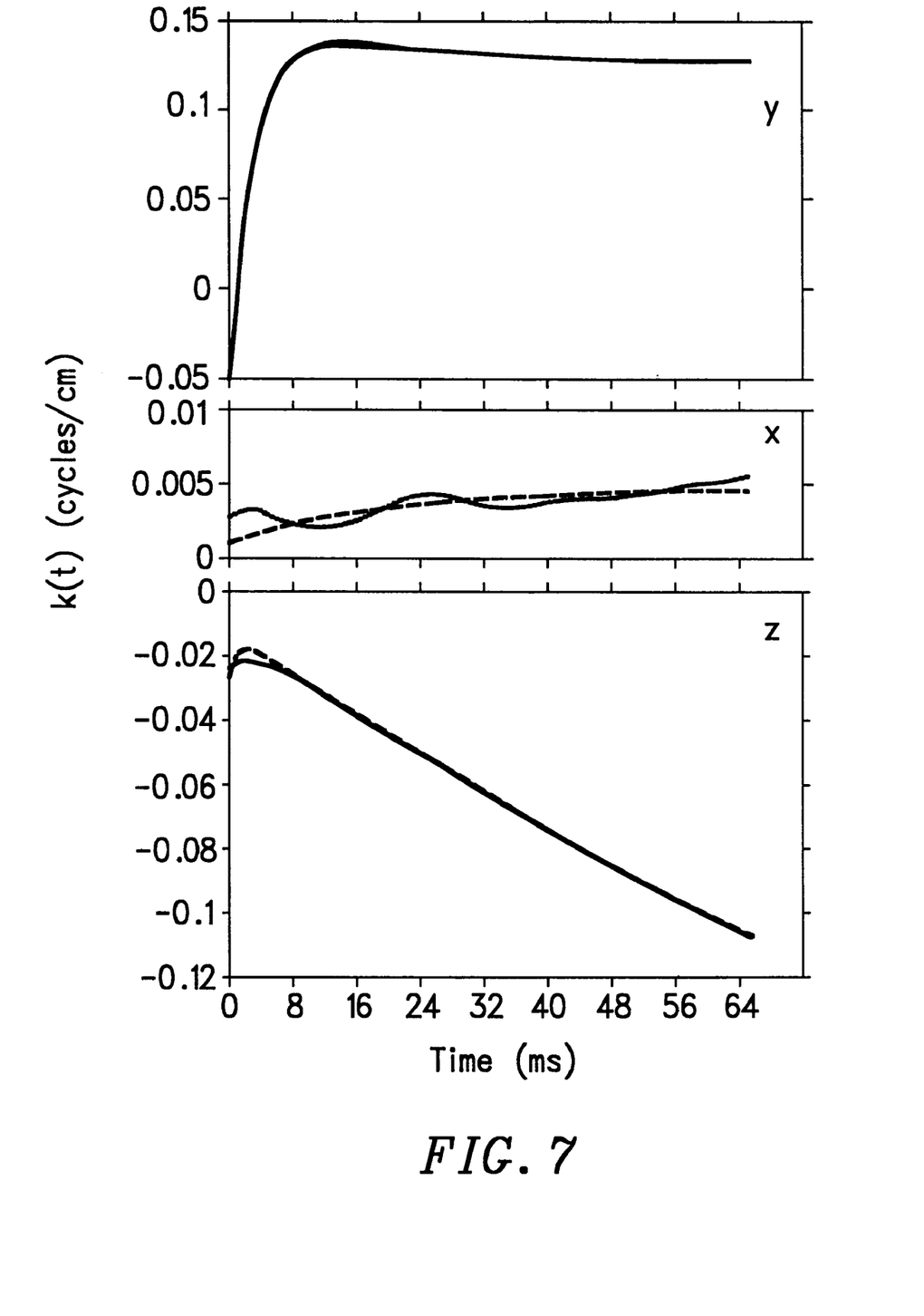
FIG. 7 is measured residual gradient k-space trajectories and impulse-response fit results along the y, x, and z axes. The measured trajectories are shown as solid lines, while the fit results are shown as dotted lines. Note the different scales along the ordinates. For each axis, the uncertainty in the measured values of k(t) was determined to be ≦0.01 cycles/cm. Because of this, the results in the middle figure are considered statistically insignificant.

FIG. 7 shows the eddy current k-space trajectories obtained from the 3D spin-echo data. The measured trajectories are shown as solid lines, while the fit results are shown as dotted lines. Note the different scales along the ordinance. For each axis, the uncertainty in the measured values of k(t) was determined to be $\leq 0.01$ cycles/cm. Also shown are the fit results from the impulse-response formalism of Eqs. [8]–[10]. For all three axes the uncertainty in k(t) was determined to be $\leq 0.01$ cycles/cm over all time points. Two exponential terms were used to model h(t) for the y and z axis data, while only one term was used for the x axis data. For all three axes the fit $\chi_v^2$ was less than 0.05, yielding a corresponding value for p of less than 0.0001.

The residual gradient effects along the y axis of the scanner were dominated by a component with a time constant of 3.02 ms. A smaller contribution with a time constant of 29 ms was also necessary to achieve the resulting fit. Because the bipolar waveform pair had been placed along the y axis, the presence of these residual gradients was not unexpected. Of greater interest was the appearance of a cross-term effect along the z axis. This consisted of a dominant short term component with a time constant of 1.1 ms, and a much smaller term characterized by a time constant of approximately 200 ms. No appreciable cross term was seen between the y and x axis. Because the uncertainty in the values of k(t) was larger than the measured points themselves, the fit to the extracted k-space trajectory along this axis could be considered statistically insignificant.

Figure 8:
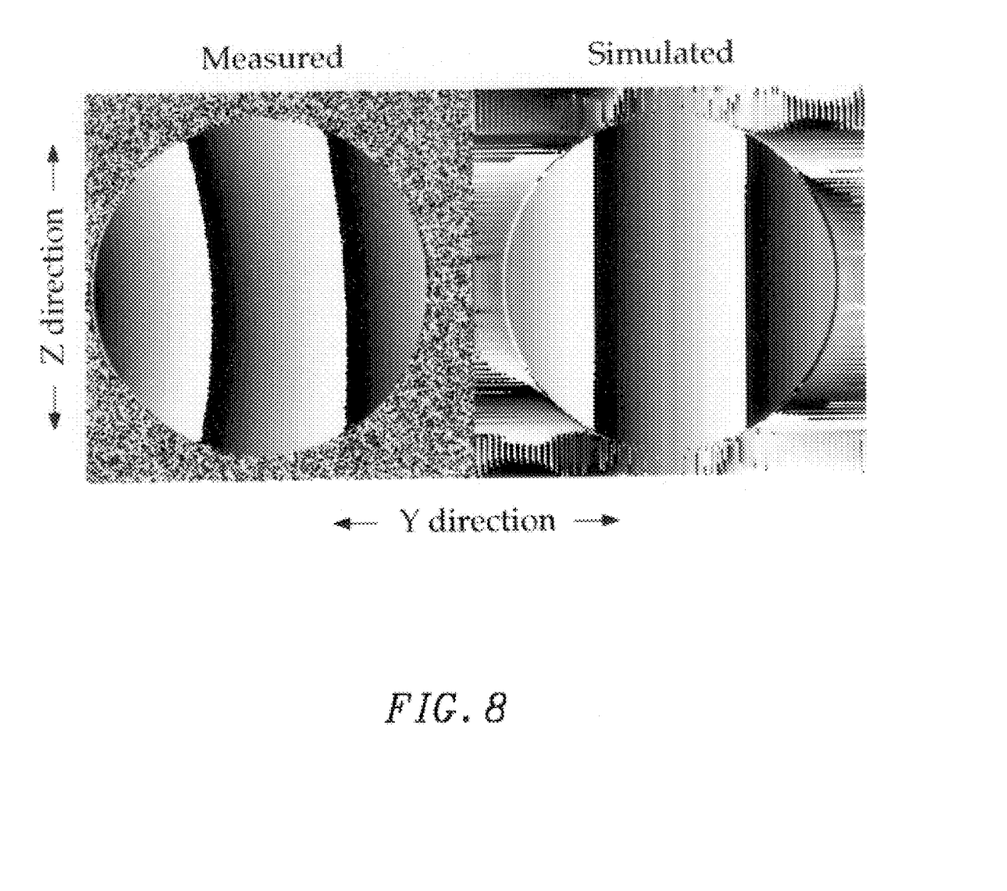
FIG. 8 illustrates the use of the method to study the performance of a commercial phase-contrast sequence. The image on the left was experimentally obtained using a velocity encoding value of 10 mm/s, and the flow encoding was place along the y direction of the scanner. The quadratic phase along the z direction is a result of the concomitant Maxwell field induced by the flow-encoding gradients which were not a simple bipolar pair. The image on the right was simulated using the impulse-response parameters generated from the data in FIG. 7.

The presence of these eddy-current effects is apparent in the phase-contrast image shown in FIG. 8. The image on the left was acquired with a commercial phase-contrast sequence. The velocity encoding value was set to 10 mm/s, and the bipolar gradients were placed along the y axis of the scanner. The image on the right was simulated using the impulse-response parameters generated from the data in FIG. 7. Also shown in FIG. 8 is the simulation result using the impulse-response parameters from the y and z axis data of FIG. 7. The phase-contrast image shows a velocity gradient of 0.23± 0.01 mm/s/pixel along the y axis, which agrees well with the value of 0.19±0.02 mm/s/pixel obtained from the simulation image. No significant velocity gradient was seen along the z axis in either image.

In the eddy current examples described above, spatial phase encoding was applied on all 3 axes, allowing the complete spatial distribution of the residual effects to be examined. The method can be simplified as needed. For example, if the cross-terms are not of interest and are small compared to the size of the test phantom (see Eqn. [6]), 1-dimensional experiments with phase encoding only along the direction of test gradient could suffice.

For this invention, accurate k-space trajectory measurements depend on the fidelity of the linear term in the phase of Eqs. [3] and [7]. Any contributions that are not directly attributable to the test waveform can be eliminated by acquiring a second set of data. This second acquisition can be taken with the polarity of the test waveform inverted, or with the amplitude of the test waveform set to zero. The appeal of the first approach is the symmetry of the data collection. However, this symmetry will also remove any phase accrual from even functions of the test waveform amplitude g (t). If these terms are of interest, as is the case with some Maxwell gradient effects, the baseline acquisition should be taken with the amplitude of the test waveform set to zero.

The Fourier-transform analysis presented here has several advantages compared to the peak-fitting technique of A. Takahashi, T. Peters, "Compensation of multidimensional selective excitation pulses using measured k-space trajectories", Magn. Reson. Med. 34:446–456 (1995). The peak-fitting technique requires a choice of fitting function that depends on the size and shape of the test phantom. This choice will influence the interpolation accuracy and the quality of the final data. In contrast, the phase in Eqs. [3] and [7] is independent of the test phantom used. Secondly, the peak-fitting technique uses only those phase-encode values in the neighborhood of the primary echo to extract the k-space trajectory. The Fourier-transform approach uses every phase-encode measurement at every time point. Therefore, with an equivalent number of phase encodes used in the data acquisition, the Fourier method will generate less noisy results than the peak-fitting technique. This is clearly apparent in FIG. 4 where significantly more structure is seen in the output of the Fourier-transform technique. This can be important if the underlying gradient waveform is of interest, since differentiation is required to compute the gradient from the measured k-space trajectory. One approach has been to smooth the measured trajectories with a polynomial fit and differentiate the result A. Takahashi, T. Peters, "Compensation of multidimensional selective excitation pulses using measured k-space trajectories", Magn. Reson. Med. 34:446–456 (1995). This has not been necessary with the Fourier technique, and the gradient shown in FIG. 5 was produced directly from the measured k-space trajectory.

In this work the results of the multidimensional analysis have been attributed to eddy-current effects. In general, this technique characterizes the spatially-dependent phase distribution of the gradient subsystem output, regardless of the source. Any residual phase shifts could arise from sources other than eddy-currents, such as amplifier error or gradient cross talk. While this technique cannot distinguish between the origin of these effects it does provide an important tool for investigating the system behavior. Furthermore, the measurements are made in the bore of the magnet, using NMR, and under conditions that represent the actual scan quite well.

The characterization measurements described here were all acquired with a relatively short sequence TR of 200 ms. The Fourier-transform technique will have trouble characterizing long time constant effects, primarily due to the finite $T_2$ of the test phantom and the instrinsic systems limits on the size of the data acquisition window. Nonetheless, the presence of any long time constant eddy currrents will affect the recovery of the gradient response between acquisition steps. By alternating the sign of the test gradients these effects can be partially, but not completely, canceled out. However, corrections to the fit parameters $g_k$ and $\lambda_k$ can be made to account for the presence of any long term components G. H. Glover, N. J. Pelc, "Method for magnetic field gradient eddy current compensation", U.S. Pat. No. 4,698, 591 (1987). Of course, these effects can be significantly reduced by lengthening the sequence TR at the expense of a longer overall acquisition time.

This approach has several advantages over the grafidy technique when measuring eddy-current effects. Grafidy has difficulty measuring very short time constants due to the finite RF pulse length at the end of the test waveform. With the Fourier-transform technique, data collection can begin even before the end of the test waveform. On the other hand, because the grafidy technique can use arbitrary delays between the test gradient and the RF pulse, it can more easily measure long time constant effects without signal loss from $T_2$ decay. Also, because the present method has a relatively coarse spatial resolution and applies the gradient after RF excitation, the test gradient must have zero area to produce a sufficient signal for analysis. This will also suppress long time constant effects.

The grafidy technique uses dedicated coils and switching mechanisms to collect data from one or a few spatial locations during any given acquisition. Generalizing this method to many spatial locations would require a large number of coils and a more complex electronic configuration. The Fourier-transform technique is able to measure the phase distribution across all three spatial dimensions simultaneously. Data collection can be performed using standard equipment, and any phantom can be used to gather data from a wide range of locations during a single acquisition. The present invention is therefore better able to characterize complex spatial dependencies.

The Fourier-transform analysis has been shown to deliver information pertaining to higher-order phase terms, such as the quadratic phase accumulations arising from concurrent Maxwell gradients. By identifying and modeling these effects, postprocessing algorithms can be implemented to remove any resulting distortions from the final images. The Fourier-transform technique can also be used to investigate the presence of cross talk between gradient axes. Such an effect along the z axis of our system was shown in FIG. 7. While interesting by virtue of its existence, it did not manifest any appreciable effect on the phase-contrast sequence investigated. This was because the dominant time constant was short enough so that the residual gradient was no longer present at the center of the acquisition readout window. The presence of this effect could be much more important in other applications such as diffusion-weighted imaging, where stronger bipolar gradients are routinely used, or on systems with larger errors.

As systems use higher strength gradients, it becomes increasingly important to characterize scanner performance. The Fourier-based technique described here provides an attractive alternative to peak-fitting when analyzing k-space measurement data. This approach can provide faster data acquisition times while still producing highly accurate results. This approach can also be easily extended for multidimensional measurements, and can be modified to measure eddy-current effects. In doing so, it addresses some of the limitations of prior techniques by allowing the measurement of short term time constant effects without the need for dedicated electronics or special coils.

A key component of the present invention for characterizing the performance of the gradient sub-system of a magnetic resonance system is the measurement of the spatial distribution of the phase shifts produced within a test object placed in system. As described above, spatial encoding was performed using phase encoding gradient pulses and reconstruction was performed by Fourier transformation of the data as a function of phase encoding amplitude (rigorously area). Other reconstruction and/or spatial encoding schemes can be employed. For example, the phase shifts could be imaged using wavelet encoding or singular value decomposition (SVD) encoding. Nonequally spaced phase encoding and non-Fourier reconstruction methods can also be employed. In the examples given for eddy current measurements, data acquisition followed the application of the spatial encoding gradients. It may be possible to apply spatial encoding gradients within the acquisition window, so long as their effect can be isolated from the desired phase shifts in the reconstruction process. A key common attribute of all these methods is the imaging of the phase shifts within the test object.

While the invention has been described with reference to specific embodiments, the discription is illustrative of the invention and is not to be construed as limiting the invention. Various modifications and applications may occur to those skilled in the art without departing from the true spirit and scope of the invention as defined by the appended claims.

What is claimed is:

1. A method of determining performance characterization of a magnetic resonance imaging (MRI) system comprising the steps of:
   a) applying an RF excitation pulse to a test phantom in the MRI system,
   b) applying a phase-encoding gradient and a test waveform of a first amplitude to the test phantom,
   c) detecting a signal from the test phantom,
   d) repeating steps a)–c) with a different amplitude of said test waveform,
   e) Fourier transforming the detected signals, and
   f) determining k-space trajectory from the Fourier transform.

2. The method as defined by claim 1 wherein the detected signal is $$S(k_{pe}, t) = \int d\vec{r}\, p(\vec{r}, t) e^{-i\{\epsilon(\vec{r}, t) + (k(t) + k_{pe})x\}},$$

where k(t) is a time evolution of the k-space trajectory produced by the test waveform, g(t), and $k_{pe}$ is the k-space offset produced by the phase-encoding gradient, and the phase term $\epsilon(\vec{r}, t)$ contains any contributions from eddy currents, and $P(\vec{r}, t)$ is the relaxation-modulated density of the test phantom.

3. The method as defined by claim 2 wherein the Fourier transformed detected signal is $$I(x, t) = FT\{S(k_{pe}, t)\} = p(x, t) e^{-i\{\epsilon(x, t) + k(t)x\}}.$$

4. The method as defined by claim 3 wherein steps a), b), and c) are repeated with the different amplitude of the test waveform set to zero.

5. The method as defined by claim 3 wherein steps a), b), and c) are repeated with the different test waveform, is the negative of said first amplitude and the Fourier transformed detected signal is $$I_\pm(x, t) = p(x, t) e^{-i\{\phi(x, t) \pm \psi(x, t) \pm k(t)x\}}$$

where $\epsilon(x, t)$ is in terms of even and odd components ($\phi(x, t)$ and $\psi(x, t)$ respectively, under the transform g(t)→-g(t).

6. The method as defined by claim 5 and further including temporal phase unwrapping data at time $t_n$ recursively by:

$$U(\theta_\pm(t_n, x)) = U(\theta\pm(t_n, x) - \theta_\pm(t_{n-1}, x)) + U(\theta_\pm t_{n-1}, x)). \quad [4]$$

where $\mu(\cdot)$ represents an unwrapping algorithm to remove any phase discontinuities and $\theta_+(\cdot)$ is the phase.

7. The method as defined by claim 6 where k(t) is extracted from the combination $(\theta_+(\cdot) - \theta_-\cdot)/2$ using a least squares linear fit to the spatial dependence.

8. The method as defined by claim 7 wherein g(t) is an echo-planar readout waveform placed along the x axis.

9. The method as defined by claim 8 wherein a phase-encode rewinder and spoiler gradient are included in the phase-encoding gradient.

10. The method as defined by claim 1 wherein g(t) is an echo-planar readout waveform placed along the x axis.

11. The method as defined by claim 10 wherein a phase-encode rewinder and spoiler gradient are included in the phase-encoding gradient.

12. The method as determining performance characterization of a magnetic resonance imaging (MRI) system comprising the steps of:
   a) applying an RF excitation pulse to a test phantom in the MRI system,
   b) applying a phase-encoding gradient and a test waveform to the test phantom including a gradient pair to induce eddy currents along a given axis,
   c) detecting a signal from the test phantom,
   d) Fourier transforming the detected signal, and
   e) determining k-space trajectory form the Fourier transform.

13. The method as defined by claim 12 wherein steps a), b), and c) are repeated to acquire a second signal from the test phantom with the polarity of the gradient pair reversed, the detected signals after step d) being $$I_\pm(\vec{r}, t) e^{-i\{\phi(\vec{r}, t) \pm \psi(\vec{r}, t) \pm \vec{k}(t)\vec{r}\}}.$$

where k(t) is the k-space trajecting produced by any residual gradients present during a readout window.

14. The method as defined by claim 13 wherein steps a) and b) provide a gradient-echo acquisition.

15. The method as defined by claim 13 wherein steps a) and b) provide a spin-echo acquisition.

16. A method for characterizing the performance of a magnetic resonance (MR) system comprising the steps of:

a) applying an RF excitation pulse to a test object in the MR system, b) applying a spatial phase encoding gradient pulse after step (a), said phase encoding pulse characterized by its area, c) applying a test gradient waveform of a first amplitude after step (b), d) repeating steps a)–c) with a different amplitude of said test gradient waveform, e) detecting a signal form the test object, f) repeating steps (a) through (d), varying the area of said phase encoding pulse to obtain signals as functions of the phase encoding area, g) converting the signals from step (e) to signals as a function of position in the test object, and h) analyzing the phase of the signals from step (g).

17. The method of claim 16 in which steps (a) through (d) are repeated with the different amplitude of the test gradient waveform is the negative of said first amplitude.

18. The method of claim 16 in which steps (a) through (d) are repeated with the different amplitude of the test gradient waveform set to zero.

19. The method of claim 16 in which step (f) includes performing a Fourier transform on the signals as functions of phase encoding area.

20. The method of claim 19 in which step (d) is performed substantially simultaneously with step (c).

21. The method of claim 20 in which step (g) is used to compute the k-space trajectory generated by said test gradient.

22. The method of claim 19 in which step (e) is performed after step (d).

23. The method of claim 22 in which step (g) is used to measure the residual magnetic fields present after the termination of the test gradient waveform.

24. The method of claim 23 in which the residual fields are due to eddy currents and gradient amplifier imperfections.

* * * * *